(12) United States Patent
Godijn et al.

(10) Patent No.: US 7,533,793 B2
(45) Date of Patent: May 19, 2009

(54) SOLDER PREFORMS FOR USE IN ELECTRONIC ASSEMBLY

(75) Inventors: Paul Godijn, Huizen (NL); Wim Veldhuizen, Leersum (NL); Patrick Lusse, Delft (NL); Mitchell T. Holtzer, Rockaway, NJ (US); Rob van Ekeren, Utrecht (NL); Martin de Haan, Driebergen (NL)

(73) Assignee: Fry's Metals, Inc., Jersey City, NJ (US)

( * ) Notice: Subject to any disclaimer, the term of this patent is extended or adjusted under 35 U.S.C. 154(b) by 476 days.

(21) Appl. No.: 11/012,457

(22) Filed: Dec. 15, 2004

(65) Prior Publication Data

US 2005/0184129 A1    Aug. 25, 2005

Related U.S. Application Data

(60) Provisional application No. 60/546,609, filed on Feb. 20, 2004.

(51) Int. Cl.
    *B23K 35/00*    (2006.01)

(52) U.S. Cl. .......................... 228/56.3; 228/13; 72/333; 72/324; 72/325; 72/326; 72/327; 72/328; 72/329; 72/330; 72/331; 72/332; 156/250; 156/261; 156/570

(58) Field of Classification Search ............... 228/56.3, 228/13; 72/324–341, 404, 405.1; 156/250, 156/261, 510
    See application file for complete search history.

(56) References Cited

U.S. PATENT DOCUMENTS

| 4,435,885 | A | * | 3/1984 | Suzuki et al. | 29/2 |
| 5,954,262 | A | * | 9/1999 | Inoue et al. | 228/245 |
| 2004/0173660 | A1 | * | 9/2004 | Lodge et al. | 228/56.3 |

* cited by examiner

*Primary Examiner*—Kiley Stoner
*Assistant Examiner*—Erin B Saad
(74) *Attorney, Agent, or Firm*—Senniger Powers LLP

(57) ABSTRACT

A solder preform for use to attach an electronic component to a substrate. The preform is for placement by a pick-and-place machine using a vacuum nozzle which picks the preform from a preform holder. Each of the sides of the preform configured to function as a vacuum side pick up surface has an enlarged planar surface area. Methods for forming such solder preforms are also disclosed.

20 Claims, 7 Drawing Sheets

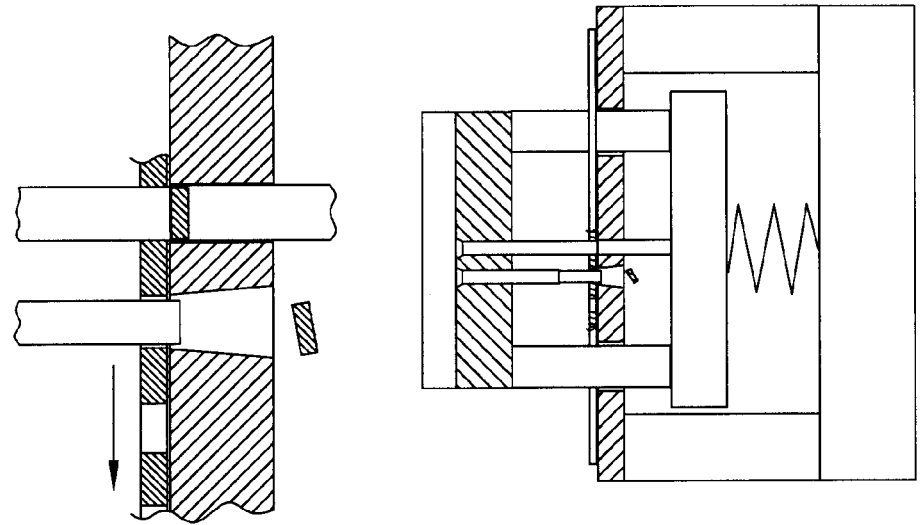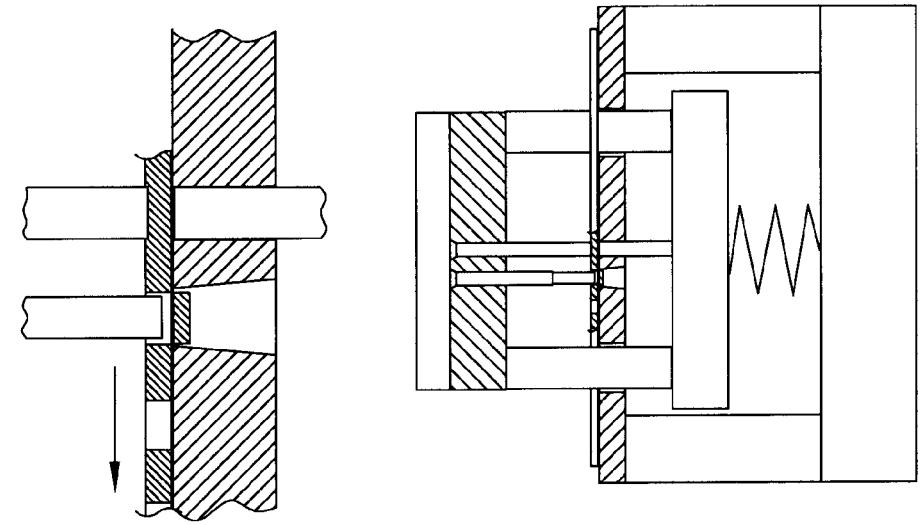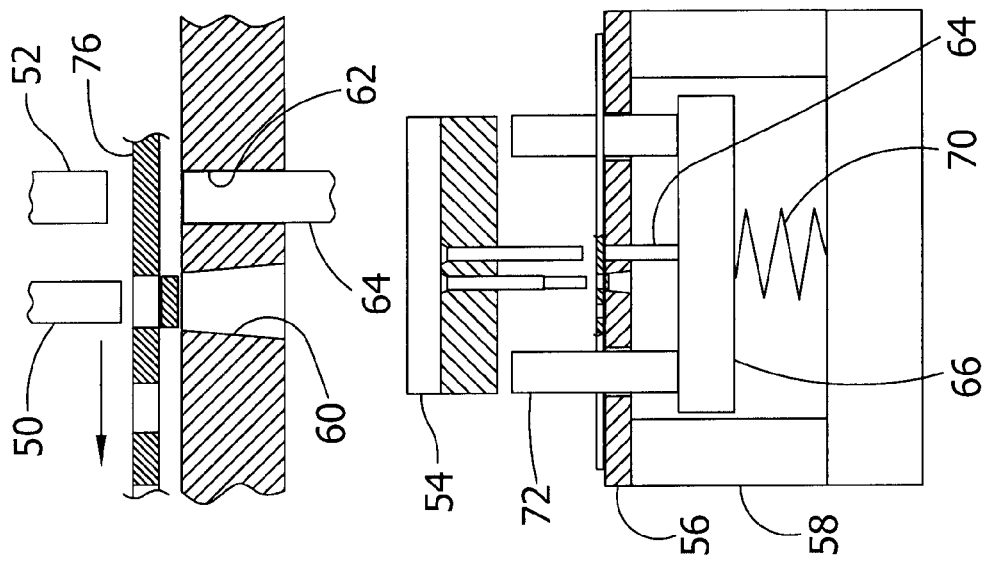

SOLDER PREFORMS FOR USE IN ELECTRONIC ASSEMBLY

REFERENCE TO RELATED APPLICATION

This application is based on provisional application Ser. No. 60/546,609, filed Feb. 20, 2004, which is incorporated herein by reference.

FIELD OF THE INVENTION

This invention relates to solder preforms for use in connection with surface mount technology (SMT) or through-hole soldering in which solder preforms are picked by vacuum and placed in position for subsequent reflow in the assembly of electronic components on substrates such as printed circuit boards.

BACKGROUND OF THE INVENTION

Inadequate solder volume commonly occurs when through hole components/connectors are soldered using a pin-in-paste process. Solder paste deposit height may be limited by the use of thinner stencils (5 mils or less) to eliminate solder balls or slumping in fine pitch applications. Using overprinting (apertures larger than the plated through hole annular ring) to provide additional solder volume often results in bridging or random solder balls. Using thicker stencils (8 mils or more) is an option, but this cannot meet the solder volume requirements in certain cases, such as when thick boards (0.092" or greater) are used, or when pins with rectangular cross sections are inserted into round through holes.

Square leads soldered into round plated through holes are a common cause of a solder paste volume deficit in pin-in-paste processes. For example, when soldering a square pin with 0.025" sides into a 0.038" round hole (the smallest round hole that this pin fits into) using a thick stencil (0.010"), substantial overprint (200%), a thin board (0.062"), high transfer efficiency of the paste (100%), and no paste drippage from the bottom of the hole, only 56% of the volume between the pin and barrel sidewalls defining the hole will be occupied by solid solder after reflow.

The problem of inadequate solder volume in SMT processes has been addressed by the use of solder preforms. Solder preforms are precise metal shapes which provide a highly repeatable volume of solder. In contrast to solder paste, solder preforms are 100% metal content by volume. They are used in conjunction with solder paste to incrementally increase the volume of solder joints, which increases reliability in connections subject to mechanical fatigue, and increases signal-to-noise ratios in interconnections delivering high frequency signals. Preforms are produced by high-speed stamping or forming from a solder wire or ribbon.

In assembling components using solder preforms, solder preforms are picked from a solder preform holder (typically a tray or reel of tape formed with pockets for holding the preforms) by a pick and place apparatus of the type that is known in the art for placing chips on boards, such as available from Panasonic Factory Automation Company of Elgin, Ill. under the model numbers BM221 CM202, CM 301 and others. Each preform is presented to a vacuum nozzle which picks the preform up by application of vacuum when the nozzle is proximate the preform. The nozzle then moves to a predetermined position over a substrate and the vacuum is interrupted or at least reduced in strength sufficiently to release the preform and place it in its proper position on the substrate. High error rates can result if there is not a well sealed vacuum between the nozzle and the preform, because the nozzle will not pick up the preform, or it will release the preform prematurely.

One cause of a poorly sealed vacuum is curvature at corners or edges of the top or bottom surface of a preform. This curvature can be imparted by forces acting on the preform as it is stamped from metal stock. If this area of curvature occupies a substantial fraction of either the top or bottom surface of a preform, the margin for error for the vacuum nozzle is drastically reduced. Poorly sealed vacuum can also occur if the top and bottom surfaces of the preform are not substantially parallel.

SUMMARY OF THE INVENTION

Briefly, therefore, the invention is directed to a solder preform for use to attach an electronic component to a substrate. The preform has a metal body configured for registration in a solder preform holder in a position with a vacuum pick up side of the metal body presented for pick up by a vacuum nozzle of a solder preform pick-and-place apparatus. The metal body has multiple sides, including sides configured to function in the solder preform holder as the vacuum pick up side. Each of such sides has an overall surface area comprising a planar region constituting at least about 90% of said overall surface area.

The invention is also directed to a method of making a solder preform for use to attach an electronic component to an electronic component substrate. The method comprises stamping a metal body from metal stock by action of a punch and a die. In the method, the punch has a flat punch surface which forces the metal stock into a die opening against a flat anvil surface opposing the flat punch surface to form the preform, wherein the preform has multiple preform sides formed by the flat punch surface, said opposing flat anvil surface, and walls of the die defining said die opening. The multiple preform sides include a maximum of preform sides configured to function in a solder preform holder as a vacuum pick up side.

In another aspect the invention is directed to a method of making a solder preform for use to attach an electronic component to an electronic component substrate. In this aspect the method comprises operating a first punch to punch a center opening in metal stock, and operating a second punch to form an annulus around the center opening by moving the second punch through a stroke in which a flat punch surface on the second punch forces the metal stock into a die opening and against a flat anvil surface opposing the flat punch surface of the second punch. The annulus constitutes the solder preform and has annular preform sides each configured to function in a solder preform holder as a vacuum pick up side, The sides are formed by the flat punch surface of the second punch and the flat anvil surface opposing the flat punch surface of the second punch.

Other objects and features will be in part apparent and in part pointed out hereinafter.

BRIEF DESCRIPTION OF THE DRAWINGS

FIGS. 7 and 8 are schematic illustrations of solder preform forming operations.

DETAILED DESCRIPTION OF PREFERRED EMBODIMENTS

Figure 1:
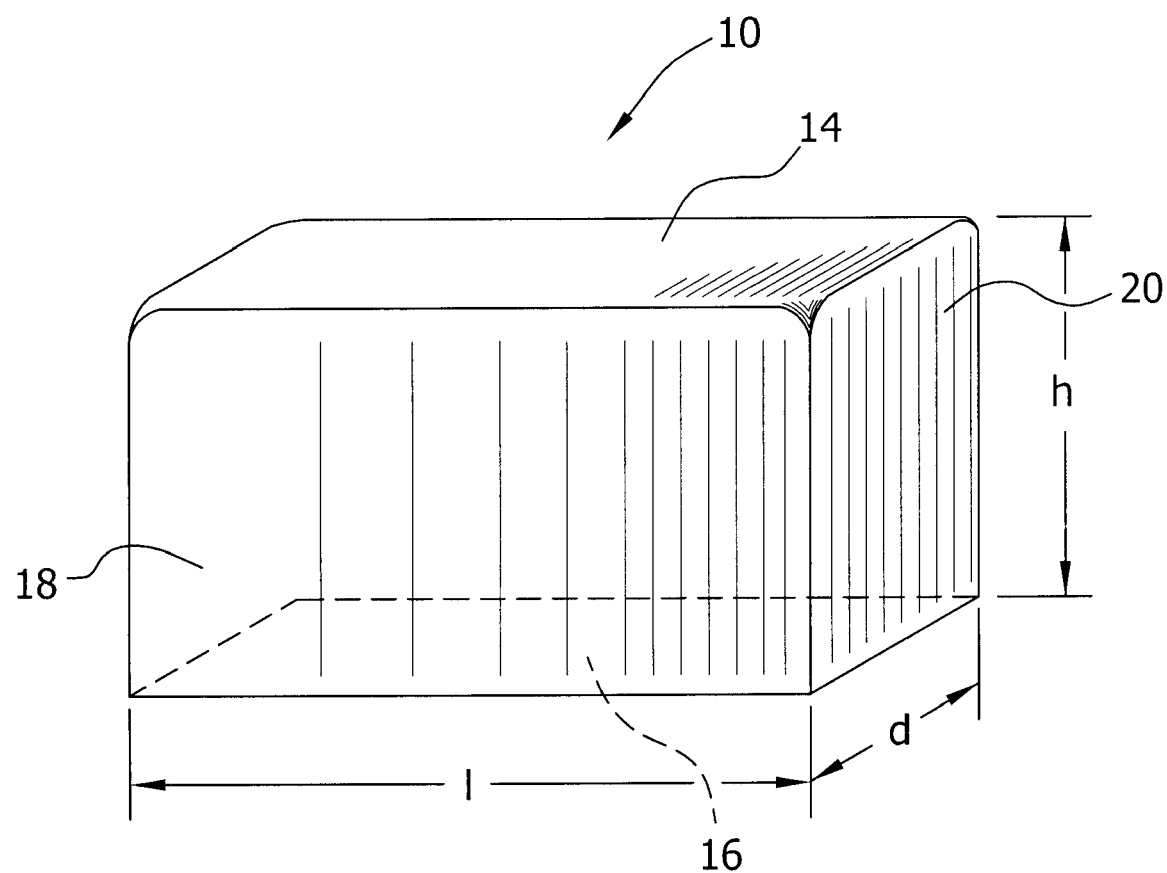
FIGS. 1 and 6 are schematic perspective views of solder preforms.

FIG. 1 illustrates one embodiment of a solder preform of this invention, designated in its entirety by the reference number 10. The preform 10 has multiple preform sides including a top surface 14, a bottom surface 16, opposite side surfaces 18, and opposite end surfaces 20. Although solder preforms of this invention can have many sizes, an exemplary preform has a length of 0.060 in., a height of 0.03 in., and a depth (or width) of 0.03 in., depicted as dimensions l, h, and d in FIG. 1. This particular size preform is known as an "0603." Other sizes include 0.12×0.06×0.06 in. ("1206"), 0.08×0.05×0.05 in. ("0805"), and 0.02×0.01×0.01 in. ("0201"). These preforms therefore have two sides (end surfaces 20) which are essentially square and four sides (top surface 14, bottom surface 16, and side surfaces 18) which are rectangles with adjacent sides of unequal length. That is, such preforms have two sides which are relatively smaller in area and four sides which are relatively larger in area. While these preforms are generally rectangular, the invention is also directed to preforms of other shapes, such as cubic or annular, e.g., shaped as discs, washers, or picture frames.

In use, a preform is transferred to a preform holder, which presents the preform to a vacuum pick up nozzle. The vacuum pick up nozzle picks the preform up and transfers it to a pad or other substrate. The holder for generally rectangular preforms as described above typically has a series or array of generally rectangular recesses for receiving preforms. Each recess is rectangular and slightly larger than the larger sides of the preforms. These larger sides are the top, bottom, and opposite side surfaces in the orientation discussed above and shown in FIG. 1, and do not include the end surfaces. That is, each recess for 0603 preforms is slightly larger than the four 0.06 in.×0.03 in. sides of an 0603 preform. Each recess for 0805 preforms is slightly larger than the four 0.08 in.×0.05 in. sides of an 0805 preform. Like these larger sides of the preforms, the recesses are rectangles with adjacent sides of unequal length. For example, a preform holder recess for receiving an 0603 preform has a rectangular shape with adjacent sides of unequal length, such as 0.07 in.×0.04 in., as viewed from above. Of course, if the preform has a shape other than rectangular, the recesses in the holder would have correspondingly different shapes.

Each preform is transferred to the preform holder, which is typically a tray or reel of tape. The preform is received is a corresponding recess in such a manner that one of the four relatively larger sides faces up and away from the holder, and one of the relatively larger sides faces down. The side facing up serves as a vacuum pick up side and the side facing down serves as a base side. For the preform described above and shown in FIG. 1, therefore, as the preform is randomly spilled onto a preform holder and comes to rest in a recess in the preform holder, one of the top surface, bottom surface, and two side surfaces will face down and therefore serve as the base side. On the other hand, one of the top surface, bottom surface, and two side surfaces will face up and serve as the vacuum pick up side. When the preform is received in a respective recess in the holder, the base side of the preform rests on the bottom wall of the recess.

It will be understood that the maximum number of sides of a preform which can function as vacuum pick up side when the preform is received in a preform holder will vary depending on the geometry of the preform. For example, a rectangular preform which is configured as shown in FIG. 1 and which is receivable in a rectangular recess of a preform holder has a maximum number of four sides configured to function as a vacuum pick up side, i.e., the top surface, bottom surface and two opposite side surfaces. The two end surfaces are not configured to function as a vacuum pick up sides, since neither side will ever face up when the preform is properly received in a recess of the preform holder. A cubic preform receivable in a square recess of a preform holder has a maximum number of six sides configured to function as a vacuum pick up side, because any of the six sides of the cube has a configuration potentially capable of functioning as the vacuum pick up side. For an annular preform, the maximum number of sides configured to function as a vacuum pick up side is two because only the two major annular sides have the configuration necessary to function as the vacuum pick up side. Other solder preform configurations have other maximum numbers of sides configured to function as the vacuum pick up side. Thus, the "maximum" number of preform sides configured to act as a vacuum pick up side can vary over a wide range, including two, three, or four or more sides.

A significant lack of planarity in the vacuum pick up side can inhibit formation of a good vacuum seal between the nozzle and preform, as vacuum leaks from between the nozzle and pick up side. Further, a significant lack of planarity in the base side causes the preform to rock on the bottom wall of the recess in which it is received when contacted by the vacuum pick up nozzle, and thereby inhibits formation of a good vacuum seal between the nozzle and preform. Accordingly, it is desirable that the vacuum pick up and base sides of the preform have substantial planarity.

Figure 2:
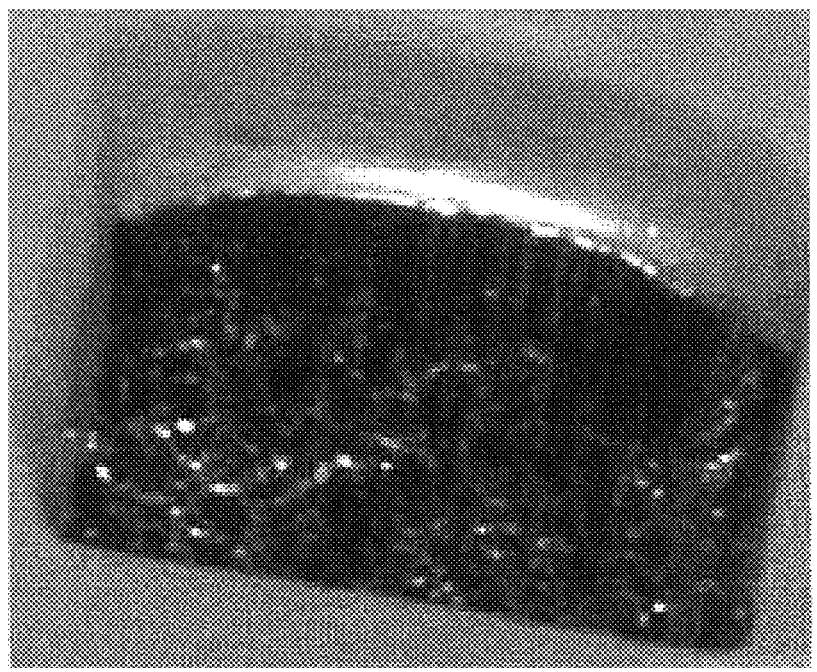
FIG. 2 is a photograph of a solder preform.

FIG. 2 shows a conventional rectangular solder preform having significant curvature at its corners on one of its sides. This curvature is imparted by forces acting on the preform as it is stamped from metal stock, as demonstrated in FIG. 3. This side with the curvature may end up being the top surface, the bottom surface, or one of the side surfaces. When placed in a preform holder, if the side with substantial curvature faces up and away from the holder, it is the vacuum pick up side. If this surface faces down, it is the base side. The lack of planarity shown in FIG. 2 can inhibit formation of a good vacuum seal between the nozzle and preform, or can cause the preform to rock when contacted by the vacuum pick up nozzle.

To minimize the risk of vacuum leakage, it is desirable that as much of the vacuum pick up side as reasonably possible be planar. Planar in this context does not mean absolutely planar, but it means sufficiently planar to hold a vacuum against a standard rigid vacuum pick up nozzle of the type employed in solder preform pick-and-place equipment. For the 0603 and other rectangular conformations, these characteristics are desirable in the larger sides, i.e., in the sides which are presented as vacuum pick up surfaces by a preform holder having recesses which are rectangles with adjacent sides of unequal length.

In one aspect, therefore, a preform of this invention is preferably constructed such that at least one of the sides configured to function as a vacuum pick up side has enhanced planarity. Even more preferably, more than one such side (e.g., two sides, three sides, four sides) has enhanced planarity. Even more preferably, each and every one of the sides that could potentially function as a vacuum pick up side, i.e., the maximum number of such sides, has enhanced planarity. As used herein, "enhanced planarity" of a vacuum pick up side means that the side desirably has an overall surface area comprising a planar surface region which constitutes at least about 90% of such overall surface area. It is also desirable that each and every one of the sides that could potentially function as the base side, i.e., the maximum number of base sides, has an overall surface area comprising a planar region which constitutes at least about 90% of such overall surface area. There are certain embodiments of the invention where each such planar region constitutes at least about 95% of the overall surface area, and other embodiments where each such planar region constitutes at least about 98% of such overall surface area.

Figure 4:
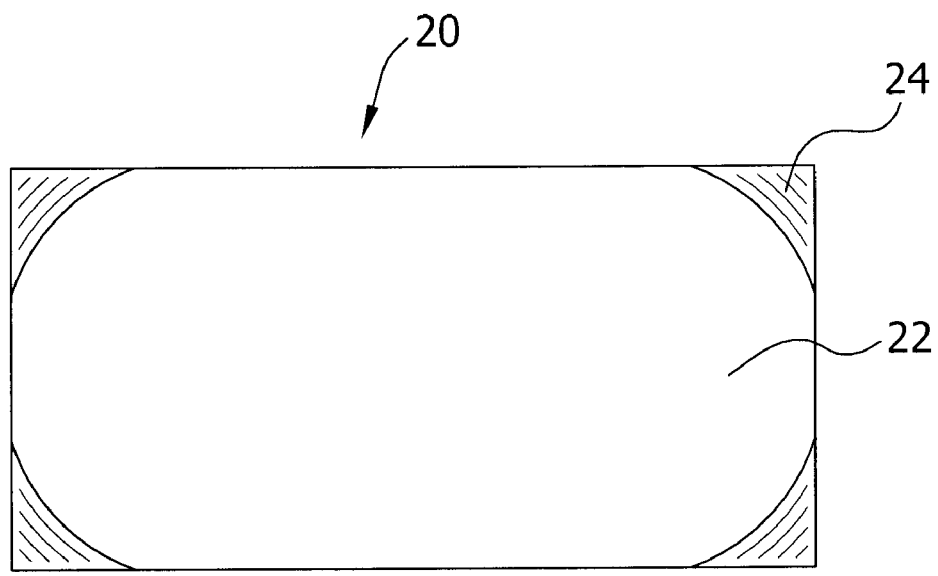
FIGS. 4 and 5 are schematic illustrations of side surfaces of solder preforms.
Figure 5:
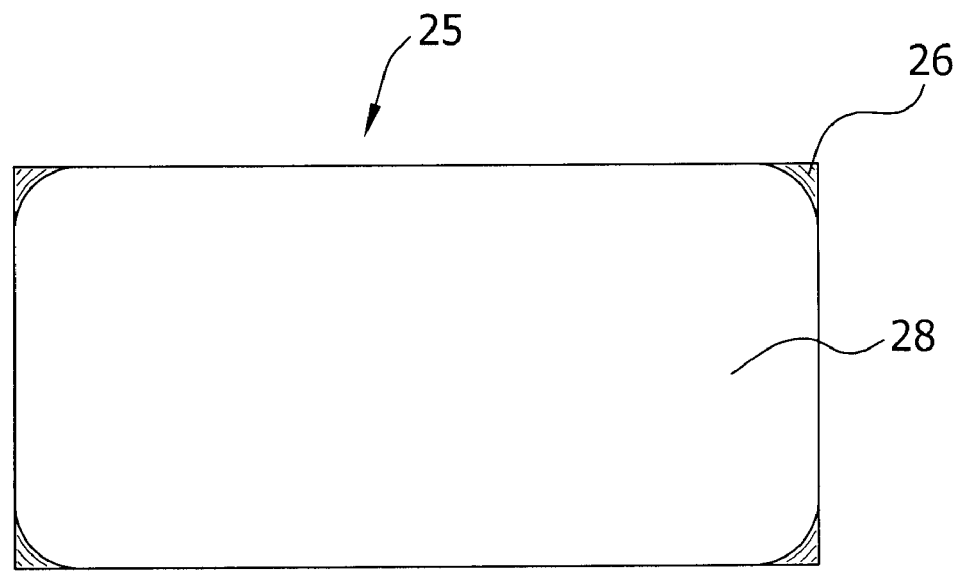

FIG. 4 illustrates a side surface 20 which is configured to function either as a vacuum pick up side of the preform or as a base side of the preform. The side comprises the entirety of the surface area shown in FIG. 4, with the region 22 being planar and the region(s) 24 at the periphery being curved. In accordance with one aspect of this invention, the size of the planar region 22 is increased compared to prior solder preforms, thereby increasing the size of the area which can effectively be used as a vacuum pick up surface. Increasing the size of the planar region 22 involves decreasing the size of curved areas at the corners of the preform. A comparison of FIGS. 4 and 5 demonstrates that by reducing the size of the curved region(s) of one side from that shown at 24 in FIG. 4 to that shown at 26 in FIG. 5, the size of the planar region which can be used as a vacuum pick up surface increases from that shown at 22 in FIG. 4 to that shown at 28 in FIG. 5. In accordance with one aspect of this invention, the planar region 28 preferably constitutes at least about 90% of the overall surface area of side 25.

Advantageously, a larger planar region (e.g., 28 in FIG. 5) on a preform of this invention increases the margin for error in operation of a vacuum pick up nozzle picking the preform up. It will be noted in this regard that the nozzle may in error stray from its intended target of the center of the preform. For example, by one estimate nozzles have an accuracy in the x and y directions of plus or minus about 0.005 in. (0.12 mm). Another source of error is that the preform may be positioned off center of its intended position of registration vis-a-vis the nozzle, because the preforms are not sized for a snug fit in the recesses of the preform holder, and the holder typically allows for some shifting of the preform in the recess as a result. The nozzle has a greater chance of success in picking up the preform in the face of these errors if the preform has a larger planar region on the vacuum pick up side of the preform.

Another advantage of a larger planar region on the vacuum pick up side of the preform is that a larger nozzle can be used. A larger nozzle exerts more vacuum in picking up the preform, thereby improving reliability.

Figure 6:
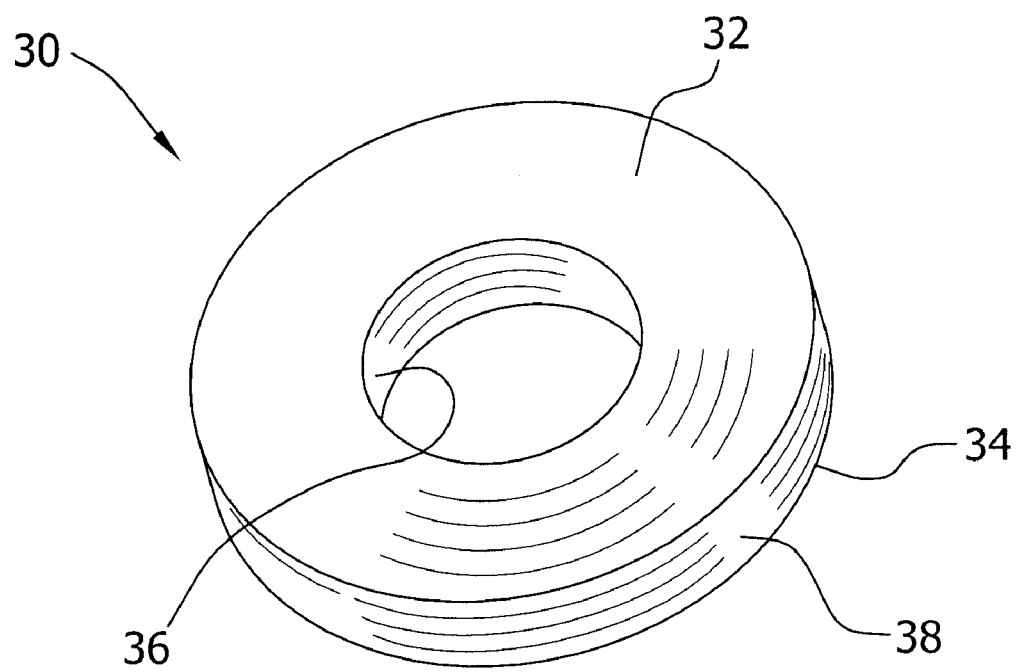

An alternative preform configuration is depicted at 30 in FIG. 6. In this embodiment, the preform 30 comprises an annular metal body having opposing annular faces, including a top annular face 32 and a bottom annular face 34. The annular body has an outer edge 38 and an inner edge 36 defining a center opening through the annular body having an inner diameter. This configuration is for use in connection with an annular vacuum nozzle which projects an annular vacuum field surrounding a central dead zone generally corresponding to the center opening of the annular metal body.

The specific metal from which the preforms are made is not critical. Tin-based solders such as Sn (63%) Pb(37%), Sn (62%) Pb (36%) (Ag 2%), or Sn (96.5%) Ag(3%) Cu (0.5%) are typical for electronics applications.

FIGS. 7A-C illustrate one method of making a solder preform of the invention involving the use of a tool. The tool comprises a punch mechanism which includes left 50 and right 52 punches carried by a punch support 54. The punch support is reciprocated in an up and down direction by a suitable drive mechanism (not shown) relative to a platform 56 supported in fixed position on a base 58. The platform has left 60 and right 62 openings therein. As viewed in FIG. 7A, the right opening 62 (which functions as a die cavity in this embodiment) has generally vertical side walls, and the left opening has side walls which taper in an upward direction. The tool further comprises an anvil mechanism below the platform comprising an anvil 64 carried by an anvil support which is supported by one or more springs which function to urge the anvil up into the die cavity to a position in which the flat upper surface of the anvil 64 is substantially coplanar with the upper end of the die cavity and the flat upper surface of the platform. The anvil mechanism is guided for precise up and down movement by guide rods 72 slidable in close clearance openings in the platform.

In accordance with one method of this invention, metal stock 76 (e.g., a continuous length of metal stock in the form of a ribbon, web, wire or foil) is fed incrementally from right to left as shown in FIG. 7A, with fresh solid metal stock being fed under the right punch during each successive increment of feed. It will be understood that there are two successive segments of metal stock within the working space under the left and right punches at any one time, which will be referred to as a leading segment and a trailing segment of the stock. In FIG. 7A the trailing segment is a fresh segment of stock which has not yet been worked by the tool and which is positioned under the right punch and above the die cavity containing the anvil. In FIG. 7B a thickness calibration is performed on the trailing segment, which involves moving the right punch 52 down into contact with the metal stock and holding the stock down flat against the upper surface of the platform and against the generally coplanar flat upper surface of the anvil 64 received in the die cavity. The flat upper surface on the anvil opposes the flat surface on the right punch. This thickness calibration is performed on the trailing segment to confirm that the flat surface on the anvil is just touching the bottom of the stock. This calibration step ensures that as the right punch in the next step cuts a solder preform from the trailing segment by forcing stock down into the right die cavity, the top and bottom surfaces of the stock remain parallel. This cutting is in contrast to more of a tearing operation which would be characterized by indications of stretching, in the nature of what is shown comparatively in FIG. 3. As depicted in FIG. 7C, the trailing segment of the stock is formed into a preform by action of the flat surface of the right punch forcing metal stock against the opposing flat surface of the anvil downward into the right die cavity. In this first forming step of the illustrated embodiment, the preform is not fully separated from the stock. Rather, the preform remains loosely attached to the stock.

After the preform has been formed by a downstroke of the right punch, the right punch is raised above the trailing segment and the preform (still attached to the metal stock) is pushed up and out of the die cavity by upwardly biased anvil. The stock is then advanced and what was the trailing segment of the stock under the right punch becomes the leading segment of the stock under the left punch. The leading segment (which now has a preform shape as a result of the first forming step) is fully severed and expelled from the left opening in the platform by a down stroke of the left punch during a second forming step.

Preferably, as the second forming step takes place on the leading segment of the stock, the first forming step is affected on the trailing segment of the stock. The stock is fed intermittently, with work performed on the stock between the intermittent periods of feed. With regard to the overall tool in this particular embodiment, one common downward stroke of the left and right punches simultaneously forms the preform shape in the trailing segment and the final severance and expulsion of the preform from the leading segment. Other variations are possible, and it is not essential that the left and right punches move in unison. Further, while the embodiments described above involve automatically feeding a continuous length of metal stock to the punching station, it will be understood that other embodiments are contemplated where segmented sheets of metal stock are placed (either manually or automatically) in position for the punching operations and then removed.

A preform formed by the method illustrated in FIG. 7 may be a rectangular metal body in the form of a block having multiple preform sides formed by the flat surface of the right punch, the opposing flat surface of the anvil, and the walls of the die cavity formed as the right opening in the platform. Among the surfaces formed are the above-described maximum number of preform sides configured to function in a solder preform holder as a vacuum pick up side.

FIG. 8 shows an alternative method suitable for forming the annular preform depicted in FIG. 6. One embodiment of a tool for performing this procedure is illustrated in FIG. 8 as comprising a base 80, a platform 82 supported above the base by one or more springs, and a pair of openings in the platform, the right opening 86 as shown in FIG. 8 generally corresponding to the size of one center opening to be formed in the annular preform and the left opening 88 generally corresponding to the size of the outer diameter of the preform. A left punch 90 having a flat upper surface extends up from the base and is receivable in the left opening in the platform. The tool further comprises an upper support 92 positioned above the die. The upper support is movable up and down relative to the die and to the left punch by a suitable drive mechanism (not shown). A right punch 94 affixed to the upper support and having flat lower surface extends down from the support for reception in the right opening in the platform. The tool also includes an anvil 96 having a lower surface directly opposite the upper surface of the left punch. The anvil is held in fixed position, the arrangement being such that the upper support carrying the right punch moves up and down relative to the anvil. The anvil comprises a lower part slidable in a left die cavity formed in the upper support, and an upper part slidable in a chamber formed in the upper support to ensure that the support is guided for precise vertical movement as it moves up and down.

In this particular embodiment, metal stock such as a continuous web 98 of suitable metal is fed intermittently from right to left (FIG. 8A) to move two successive segments of the metal stock into the working space between the platform and the upper support, the left segment being referred to as a leading segment and the right as a trailing segment. In FIG. 8A the trailing (right) segment is a fresh segment of the stock which has not yet been worked by the tool and which is positioned under the right punch. FIGS. 8B and 8C depict a downstroke of the upper support. During an initial stage of this downstroke, the right punch effects a first punching operation in which the punch punches a center opening in the trailing segment of the stock and ejects the cut portion of the stock in a downward direction. In a final stage of the downstroke, a second punching operation is performed on the leading segment of the stock by the left punch which punches upwardly into the die cavity in the upper support and against the flat lower surface of the opposing anvil. During this second punching operation the right punch remains in the center opening formed in the trailing stock segment to assist in registration of the leading segment as the second punching operation performed in 8C occurs. During the downstroke of the upper support, the force exerted by the upper support and right punch on the stock causes the platform to move downward against the bias of the one or more springs.

Figure 8D:
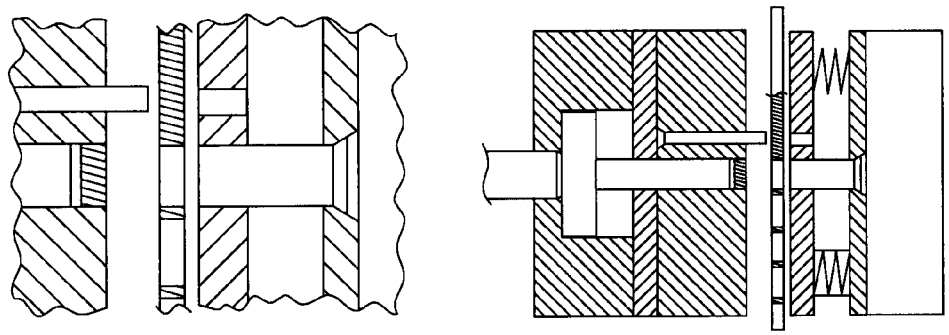
Figure 8C:
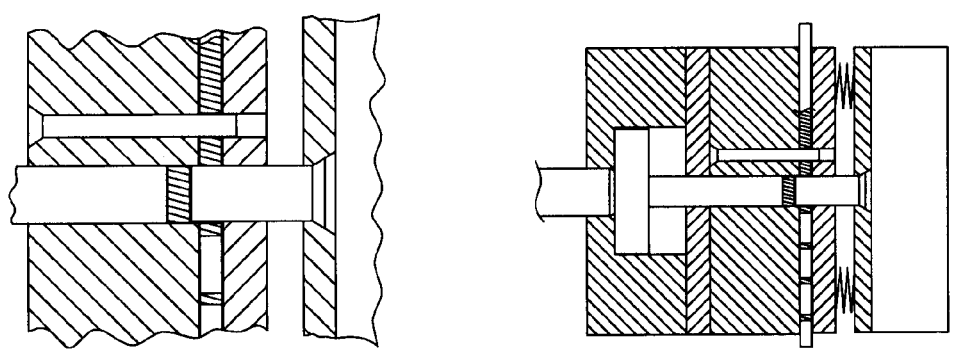
Figure 8B:
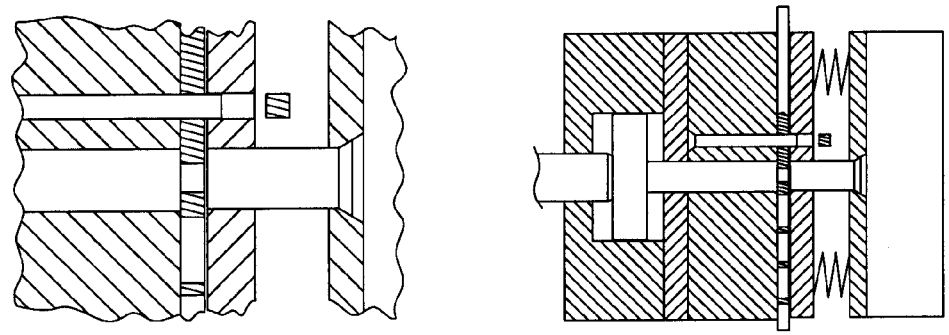
Figure 8A:
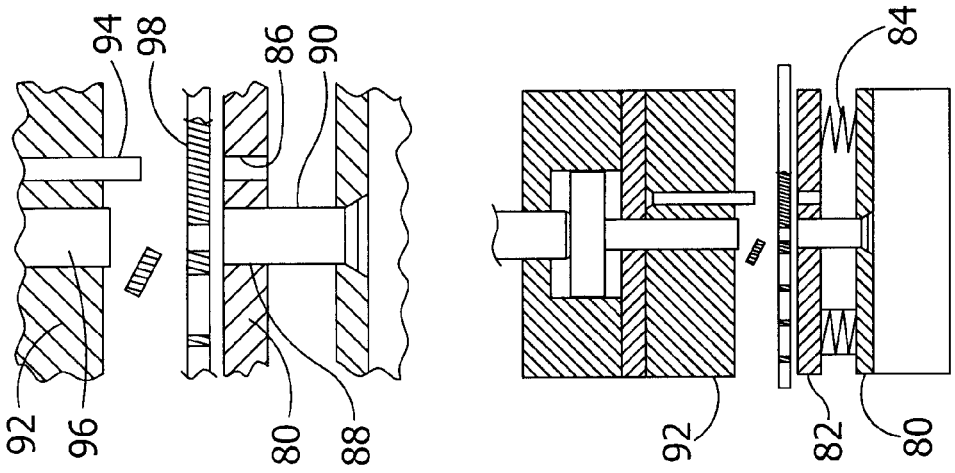

Following completion of the downstroke of the upper support, as shown in FIG. 8D, the upper support is moved through an upstroke to separate the two tooling halves. During this movement, the platform returns to its original position under the bias of the one or more springs. After the upper support has separated a sufficient distance from the stock below, the preform in the left die cavity is ejected by suitable means, such as a jet of air, to prepare for the next cycle of operation. The air emanates from a nozzle in the support.

Figure 3A:
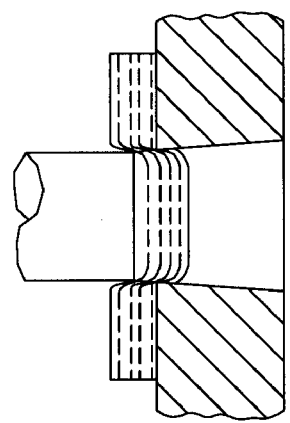
FIG. 3 is a schematic illustration of a solder preform forming operation.
Figure 3B:
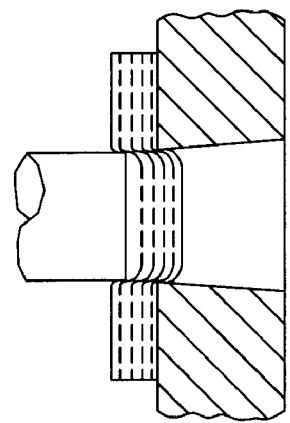
Figure 3C:
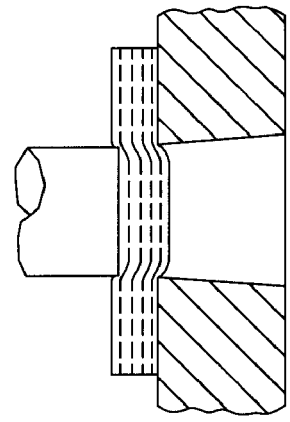

An alternative method for forming a preform of this invention is to stamp metal stock through a die in a conventional process as shown in FIG. 3. This procedure will result in a preform having sides with substantial regions of curvature, as shown in FIG. 2. The preform can then be mechanically processed to increase the "planarity" of the sides which are to function in a solder preform holder as vacuum pick up sides. That is, the preform can be processed to increase the size of the planar regions of such sides. One method of increasing the size of the planar regions is to press the preform between a roll and a tooling surface. Isostatic or hydraulic pressing may also be used. The planar regions may also be formed by a machining step using a cutting tool.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that the several objects of the invention are achieved and other advantageous results attained.

As various changes could be made in the above methods and products without departing from the scope of the invention, it is intended that all matter contained in the above description and shown in the accompanying drawings shall be interpreted as illustrative and not in a limiting sense.

What is claimed is:

1. A method of making a solder preform for use to attach an electronic component to an electronic component substrate, the method comprising:
   placing metal stock in a position between a punch having a flat punch surface and an anvil having a flat anvil surface opposing said flat punch surface; and
   moving the punch through a punch stroke in which the punch forces a portion of the metal stock against said flat anvil surface and into a die cavity to form said preform having multiple preform sides formed by the flat punch surface, said opposing flat anvil surface, and walls of the die cavity, said multiple preform sides including a number of preform sides configured to function in a solder preform holder as a vacuum pick up side; and;
   intermittently feeding a continuous length of said metal stock between said flat punch surface and said flat anvil surface, and moving the punch through said punch stroke to form said preform during a dwell period between periods of intermittent feed;
   wherein said punch is a first punch and said punch stroke of the first punch does not completely sever said preform from the metal stock, said method further comprising feeding said metal stock with the preform thereon to a second punch, and then operating said second punch through a punch stroke to completely sever the preform from the metal stock.

2. The method of claim 1 further comprising operating said first and second punches through substantially simultaneous strokes whereby the first punch forms a preform in a trailing segment of the metal stock and the second punch substantially simultaneously severs a preform from the metal stock in a leading segment of the web.

3. The method of claim 2 further comprising performing a calibration step on said trailing segment of the metal stock to determine that the metal stock is in contact with said flat anvil surface prior to the first punch moving through said punch stroke to form said preform.

4. The method of claim 1 wherein each of said number of preform sides configured to function as the vacuum pick up side has an overall surface area comprising a planar region constituting at least about 90% of said overall surface area.

5. The method of claim 1 wherein each of said number of preform sides configured to function as the vacuum pick up side has an overall surface area comprising a planar region constituting at least about 95% of said overall surface area.

6. The method of claim 1 wherein each of said number of preform sides configured to function as the vacuum pick up side has an overall surface area comprising a planar region constituting at least about 98% of said overall surface area.

7. The method of claim 1 wherein said preform has at least six rectangular sides, and wherein at least three of said six rectangular sides constitute said sides configured to function as said vacuum pick up side.

8. The method of claim 1 wherein said number of preform sides configured to function as said vacuum pick up side consist of six sides consisting of two square sides and four rectangular sides having adjacent sides of unequal length.

9. The method of claim 1 wherein said multiple sides of the preform consist of two square sides and four rectangular sides, each rectangular side having adjacent sides of unequal length, and wherein each rectangular side having adjacent sides of unequal length is configured to function as said vacuum pick up side and has an overall surface area comprising a planar region constituting at least about 90% of said overall surface area.

10. The method of claim 1 wherein said preform is a cube having six sides, each being configured to function as said vacuum pick up side and each having an overall surface area comprising a planar region which constitutes at least about 90% of said overall surface area.

11. The method of claim 2 wherein each of said number of sides configured to function as the vacuum pick up side has an overall surface area comprising a planar region constituting at least about 90% of said overall surface area.

12. The method of claim 2 wherein each of said number of sides configured to function as the vacuum pick up side has an overall surface area comprising a planar region constituting at least about 95% of said overall surface area.

13. The method of claim 2 wherein each of said number of sides configured to function as the vacuum pick up side has an overall surface area comprising a planar region constituting at least about 98% of said overall surface area.

14. The method of claim 2 wherein said preform has at least six rectangular sides, and wherein at least three of said six rectangular sides constitute said preform sides configured to function as said vacuum pick up side.

15. The method of claim 2 wherein said preform sides configured to function as said vacuum pick up side consist of six sides consisting of two square sides and four rectangular sides having adjacent sides of unequal length.

16. The method of claim 2 wherein said multiple preform sides consist of two square sides and four rectangular sides, each rectangular side having adjacent sides of unequal length, and wherein each rectangular side having adjacent sides of unequal length is configured to function as said vacuum pick up side and has an overall surface area comprising a planar region constituting at least about 90% of said overall surface area.

17. The method of claim 2 wherein said preform is a cube having six sides, each being configured to function as said vacuum pick up side and each having an overall surface area comprising a planar region which constitutes at least about 90% of said overall surface area.

18. The method of claim 1 wherein said number of preform sides configured to function in a solder preform holder as a vacuum pick up side is selected from the group consisting of two, three, four, or more sides.

19. The method of claim 1 wherein said preform is rectangular and said number of preform sides configured to function in a solder preform holder as a vacuum pick up side is four.

20. The method of claim 1 wherein said preform is cubic and said number of preform sides configured to function in a solder preform holder as a vacuum pick up side is six.

* * * * *